United States Patent [19]

Haulin et al.

[11] Patent Number: 5,692,022

[45] Date of Patent: Nov. 25, 1997

[54] BIT SYNCHRONIZER

[75] Inventors: Tord Lennart Haulin, Upsala; Per M. Segerbäck, Vällingsby, both of Sweden; Heinz Mäder, Weinfelden, Switzerland

[73] Assignee: Telefonaktiebolaget LM Ericsson, Stockholm, Sweden

[21] Appl. No.: 683,410

[22] Filed: Jul. 18, 1996

Related U.S. Application Data

[60] Continuation of Ser. No. 472,879, Jun. 7, 1995, abandoned, which is a division of Ser. No. 203,382, Mar. 1, 1994, abandoned.

[30] Foreign Application Priority Data

Mar. 1, 1993 [SE] Sweden ................... 9300679

[51] Int. Cl.$^6$ .................................................. H04L 7/00
[52] U.S. Cl. ..................................................... 375/357
[58] Field of Search .................................. 375/357, 371, 375/373, 375, 376, 377; 327/231, 233, 236

[56] References Cited

U.S. PATENT DOCUMENTS

| | | |
|---|---|---|
| 4,181,975 | 1/1980 | Jenkins . |
| 4,370,569 | 1/1983 | Hunsinger . |
| 4,535,459 | 8/1985 | Hogge, Jr. . |
| 4,756,011 | 7/1988 | Cordell . |
| 4,821,296 | 4/1989 | Cordell ................... 375/374 |
| 5,003,561 | 3/1991 | Dragotin . |
| 5,052,030 | 9/1991 | Ernst et al. ............. 375/357 |
| 5,081,655 | 1/1992 | Long ....................... 375/373 |
| 5,117,135 | 5/1992 | Lee et al. . |
| 5,278,873 | 1/1994 | Lowrey et al. .......... 375/371 |

FOREIGN PATENT DOCUMENTS 087 707   9/1983   European Pat. Off. .

*Primary Examiner*—Stephen Chin
*Assistant Examiner*—Kevin Kim
*Attorney, Agent, or Firm*—Burns, Doane, Swecker & Mathis, L.L.P.

[57] ABSTRACT

A bit synchronizer for the interpretation of a bit data stream received in a receiver when strobed by an isochronous or plesiochronous clock signal which lies in the receiver time domain is disclosed. This is achieved by alternate activation and deactivation of a first and a second phase aligner respectively, based on monitoring a delay controlled voltage of the active phase aligner. These phase aligners each utilizes differential delay lines which are comprised of differential delay elements, which in turn are comprised of pairs of inverting devices, where both devices of each pair have a controllable delay for positive edges and a pulse form restoring function for negative edges, alternatively a controllable delay for negative edges and a pulse form restoring function for positive edges. Because each DDE is constructed symmetrically, feedback from the outputs Q and $\bar{Q}$ on INV2 can be easily effected to the inputs FB and $\overline{FB}$ on INV1, and from the outputs Q and $\bar{Q}$ on INV1 in a delay element can be readily fed back to the inputs FB and $\overline{FB}$ respectively on INV2 in the preceding delay element. Because the feedback route quickly changes the ramp edge to full logic level as soon as the threshold voltage has been reached in the inverting device, the preceding stage is prepared for the restoring function that it will have for the next data edge, thereby avoiding interference effects.

9 Claims, 6 Drawing Sheets

Prior Art

Case1: Data having a lower frequency than the clock
Case2: Data having a higher frequency than the clock

BIT SYNCHRONIZER

This application is a continuation of application Ser. No. 08/472,879, filed Jun. 7, 1995 abandoned which is a divisional of application Ser. No. 08/203,382, filed Mar. 1, 1994 abandoned.

TECHNICAL FIELD

The present invention relates to a bit synchronizer, and more particularly to a bit-synchronizing device which is preferably intended for use in communications systems that operate with clock frequencies in the megahertz range and where a separate clock signal cannot be transmitted simultaneously for practical reasons.

INTRODUCTION

The relationship between physical magnitudes, signal frequency and transmission rate are important for synchronous communication in a system. When signal delays become excessive, it is not possible to interpret data reliably on the receiver side. Hitherto, the majority of electronic communications systems have operated with clock frequencies in the region of some tens of megahertz or lower. In the majority of system sizes, this means that clock signals can be generated in a manner which makes them valid for clocking through the entire system and the transmission delays become generally smaller than the clock period. The signals are able to propagate at speeds equal to roughly half the speed of light in vacuum in the majority of media, such as cables, printed circuit boards, optical fibres and integrated circuits, for instance.

The demands placed on clock distribution become progressively greater as the system speeds increase. By accurate balancing, it is possible to construct clocking distribution such that clock signals will arrive simultaneously at all sites in the system in which they are used. This enables communication to be effected between selected parts of the system with a common signal delay upper limit, so as not to exceed setup times and holding times (critical ranges) for receiving clocking elements. When still higher clock frequencies are used, it is no longer possible for all signals in the system to reach their respective destination points within the space of one clock period. Normally, it is necessary for part of the signals to reach their destinations prior to the end of the period, whereas other signals can be permitted to arrive during later periods. By utilizing this and by closely integrating the most critical parts of a system, it is possible to use higher clock frequencies and even frequencies which are so high that some signals will have transmission delays that are many times the period time. In order to be able to receive such a signal reliably, the receiving function must be capable of detecting the phase of the incoming signal and to handle correctly any phase ratio whatsoever in relation to the local clock. High clock frequencies are used in modern digital systems, wherein in many cases the time delays that may occur in transmission will reach a magnitude corresponding to the time of a single data bit.

DESCRIPTION OF THE BACKGROUND ART

Telecommunications systems have been an exception to the aforegoing for a relatively long time. In this case, the distances between communicating systems have been so great as to require synchronization already at moderate signal frequencies. Two methods have been applied chiefly in this regard:

1) Transmission of both a data signal and a clock signal from the source to the destination point, wherein the receiver receives the clock signal for interpreting the data signal. Adaptation to transmission delays for the clock and data signals must also be effected when interpreting data.

2) Recreation of the clock through an oscillating circuit or a phase-locked loop, with the aid of the so-called PLL technique. This requires the use of a line code.

After interpretation, it is also necessary in the majority of cases to transmit data to the time domain of the receiver system prior to further processing. This applies to both of the techniques given above. A double-port memory function is required for this purpose. In general, only a few signals require synchronization in these systems.

U.S. Pat. No. 4,181,975 teaches, for instance, a digital delay line apparatus for a case in which both clock signal and data signal are transmitted. The arrangement illustrates a technique of producing a digital continuous delay which replaces the incremental analogue delay elements normally used, these elements sometimes tending to introduce intermodulation between mutually adjacent signals when the signals to be delayed are digital data bits or pulses. This corresponds to the procedures mentioned under subparagraph 1) above.

U.S. Pat. No. 5,003,561 teaches another method of receiving a binary digital signal which may also contain a phase shift or jitter and with an accompanying clock signal which may have any desired phase position whatsoever in relation to the digital signal and may deviate slightly in frequency from the bit sequence frequency of the digital signal.

An example of restoring the clock in accordance with subparagraph 2) above is given for instance in U.S. Pat. No. 4, 535,459. This example is effected with the aid of two bi-stable D-flip-flops and two exclusive OR-gates and a controlled oscillator of variable frequency. A corresponding system for an NRZ system is shown in U.S. Pat. No. 5,117,135.

Another example of digital phase alignment is given in U.S. Pat. No. 4,821,296. This example utilizes the advantage of the known synchronous bit speed of incoming signals and the fact that these signals are relatively pure, wherein data is sampled at two phases 0° and 180° of the local clock with the assumption that one of these two samples will contain correct data. A similar technique is described in a corresponding U.S. Pat. No. 4,756,011 having the same inventor, according to which samples are taken at phase angles 0°, 90°, 180° and 270° of the local clock. This technique is based on the use of a large number of registers to achieve phase alignment in a larger system with many incoming signals.

Innumerable high frequency data signals are used in many present-day systems, both in the actual system and for external communication. It is not possible to control propagation delays at the high degree of accuracy required to manage the system without synchronization. The majority of signals require synchronization in such systems and the methods defined in subparagraphs 1) and 2) above have certain drawbacks in this environment.

Method 1) of transmitting both clock and data signals duplicates the number of connections for each signal. The number of connections to a circuit or a circuit board has constituted a limiting construction factor for a long time. Duplication of the number of connections for a small number of signals can normally be accepted, although it cannot be achieved for the majority of the signals.

Oscillating circuits or PLL devices for method 2) require precision time control components which also consume the scarce availability of pins. The methods 1) and 2) both require a double port memory for each signal.

These weaknesses are overcome by the present invention. All data signals can be phase aligned with a common clock signal within the local time control domain and thus do not require a double port memory function.

SUMMARY OF THE INVENTION

The construction of a delay line having a large adjustment field and a wide band width requires a plurality of delay elements to be coupled in cascade, each such element contributing to a part of the total delay. The waveform of the data signal needs to be restored in an amplifier stage after each delay stage. At the same time, it is necessary to minimize the number of delay stages in order to minimize jitter and distortion. This means that the adjustable delay stage and the waveform recreation stage are both suitably inverted so that these two together become non-inverting. This means that any difference in delay between positive and negative edges or flanks will be accumulated in the chain. Such waveform distortion is very troublesome in a delay locked loop such as this. It is essential that the output waveform is a delayed copy of the input signal. In the majority of function situations, pulse distortion will result in data corruption. To avoid this, the delay element acts in accordance with the invention as an adjustable delay element for, e.g., positive data edges and as a waveform restoring element for the negative edges. The delay element is inverting. This means that it is possible to construct a cascade-coupled chain from an even number of mutually identical delay elements, where odd elements delay, e.g., positive edges and restore negative edges. Elements having an even number order do exactly the same, although since these elements operate on inverted data the effect is the opposite, i.e. delaying of negative edges and recreation of positive edges. In this way, each signal change on its way through the delay line will obtain the required alternation between adjustable delay and signal improvement. Since all elements are identical and function with the same type of devices on the same type of data edge, the pulse distortion will be very small for an even number of elements.

The adjustable delay is obtained by controlling the edge rate of one of the edges with a biassing network. The following pulse length restoring stage will interpret this ramp as being a low level until it reaches the input threshold. The pulse length restoring stage will then quickly switch over while the ramp signal is still close to the threshold of the restoring stage. In order to avoid cross-talk effects and in order to prepare the preceding stage quickly for the restoring function that it shall have for the next data edge, each stage has a feedback route which quickly changes the ramp edge to a full logic level as soon as the threshold voltage of the receiver stage is reached.

It is not possible in the majority of systems to guarantee a stable phase relationship between a common clock and individual data signals. Thus, bit synchronizers must be able to manage phase drift between clock and data. Since the delay adjustment range of a phase aligner is limited, the locked delay loop will fasten in a fault function when the phase drift is such as to require a delay outside the usable range. Two phase aligners are used in alternate functions, in order to ensure the function. The phase aligners are constructed so as to cover a delay adjustment range of at least one unit interval. When the active phase aligner approaches the limit of its delay adjustment range as a result of following data with a driving phase ratio until the clock activates the resting or idling phase aligner and is steered to find equilibrium in the feedback loop well within the active delay adjustment range. This is a bit before or after in the bit stream in relation to the active phase aligner, depending on the direction of the phase drift. When this newly activated phase aligner becomes locked, the bit synchronizing control logic instructs the logic which receives output data from the bit synchronization to expect data from the other phase aligner. It also informs the receiving logic of the type of drift that has occurred. The receiving logic uses this information to handle input data correctly during the switching period. If the data speed is greater than the clock speed, the receiving logic will receive data from both phase aligners during the switching period. If the data speed is slower than the clock speed, it is necessary for the receiving logic to compensate in order for the same data bit to occur in mutually sequential periods during the switch over. The requisite working range can be reduced from two to one unit interval, by permitting one phase aligner to operate with an inverted clock signal.

Function control of the phase aligner of the bit synchronizer is effected with the aid of the delay control voltage of the phase aligner which is used to ensure that the upper and lower limit of the working range will not be exceeded or under-passed. A cut-over or change is initiated when the delay control voltage is too high or too low. The limit points of the usable delay function range are established by comparing the delay voltages with reference voltages. Adaptive reference voltage generators are used, since the usable delay operation range for phase alignment is dependent on supply voltage, circuit characteristics and temperature.

A first object of the present invention is to provide a bit synchronizer for interpreting a data bit stream received in a receiver, in the time domain of said receiver.

Another object of the present invention is to provide a functional control for a bit synchronizer for alternately activating and deactivating a first and a second phase aligner respectively on the basis of monitoring a delay control voltage of the active phase aligner.

A third object of the present invention is to provide a phase aligner for a bit synchronizer which will ensure, without transmitting phase correlated clock signals, that the transmitted data signal is valid at those moments at which it is strobed by an isochronous or plesiochronous clock signal which lies in the time domain of the receiver.

Another object of the present invention is to provide a differential delay line for a phase aligner, wherein the delay line is comprised of pairs of inverting elements of which both elements have a controllable delay for positive edges and a pulse form restoring function for negative edges, or alternatively have a controllable delay for negative edges and a pulse form restoring function for positive edges.

Still another object of the present invention is to provide an adaptive reference generator which will steer a function control operation for alternately activating and deactivating a first and a second phase aligner in a bit synchronizer for interpreting a data bit stream received in a receiver in the time domain of said receiver.

BRIEF DESCRIPTION OF THE DRAWINGS

The invention will now be described in more detail with reference to exemplifying embodiments thereof and also with reference to the accompanying drawings, in which.

DESCRIPTION OF EXEMPLIFYING EMBODIMENTS

Figure 1:
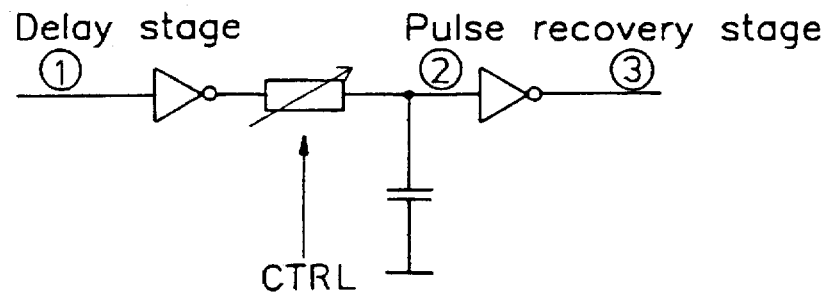
FIG. 1 illustrates schematically a prior art delay element and corresponding pulse diagram.
Figure 1:
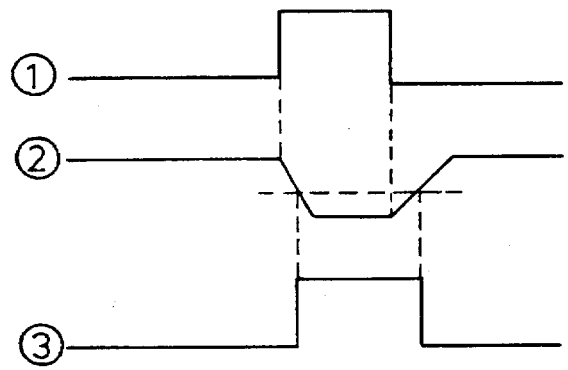

In order to delay a pulse signal for a selected period of time, it is normally necessary to divide the delay into a number of fixed or variable incremental and individual delays. FIG. 1 illustrates a delay stage according to the present standpoint of techniques, which uses an RC link whose time constant can be controlled by a control voltage CRTL. The throughpassing pulse is shown at measuring points 1, 2 and 3 respectively. The difficulty with the solution provided by the present standpoint of techniques is that both the positive and the negative edge of a pulse to be delayed must be delayed to the same extent. In other words, the pulse edges at measuring point 2, for instance, must have exactly the same slope so that the same time distance is obtained between the front edge and the rear edge of the reconstructed delayed pulse at measuring point 3 at the trigger threshold of the following inverter. If this is not achieved, the pulse will be either shortened or lengthened step-by-step as it passes through such a digital delay line. If the pulse is shortened, there is a danger that the pulse will either be too short to be interpreted correctly, or that the pulse disappears completely. When the pulse is lengthened, the pulses will gradually merge into one another, rendering the information content of the data bit signal unintelligible.

Figure 2:
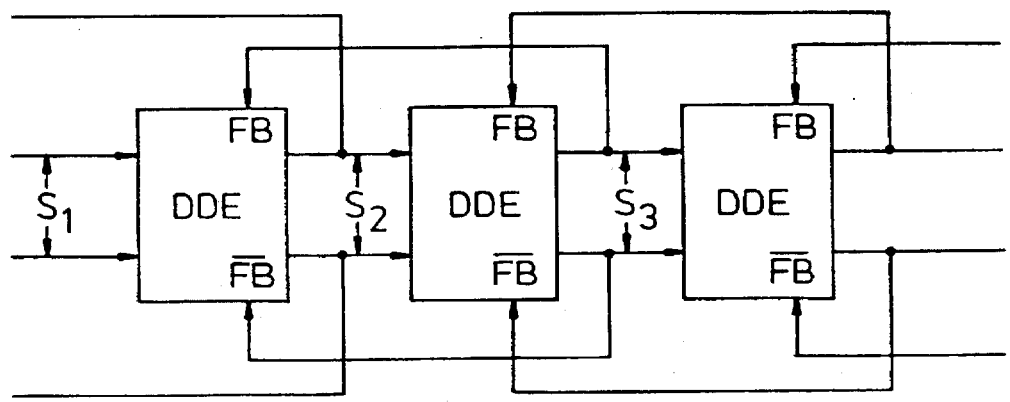
FIG. 2 is a block diagram which illustrates an inventive delay line.

FIG. 2 illustrates a digital delay line for use in a phase aligner for a bit synchronizer constructed in accordance with an embodiment of the present invention. The illustrated delay line is comprised of a number of differential delay elements DDE, which in turn are comprised of pairs of mutually identical inverting devices which have an adjustable time delay for the positive signal edges, or alternatively the negative signal edge.

Figure 3:
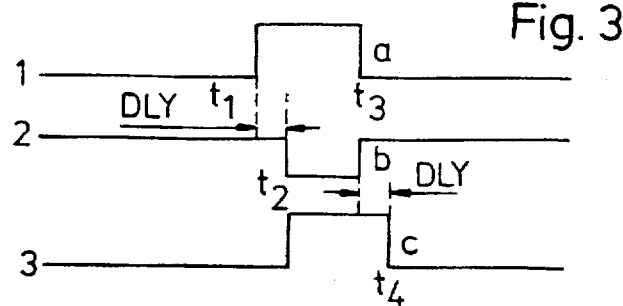
FIG. 3 illustrates schematically a data bit delay with pulse length resetting.

FIG. 3 illustrates schematically with the aid of three time diagrams 1, 2 and 3 a data bit delay with resetting of the pulse length. The signal a with given pulse length in the time diagram 1 is subjected to a delay stage in a first inverting device in which in the illustrated case the positive edge of the applied signal is delayed by an adjustable delay DLY. The time diagram 3 shows the output signal from this first inverting device after the positive edge of the signal a has been delayed by the time DLY at the same time as the pulse has been inverted to the pulse form b. The output signal from the first inverting device goes negative after time period $t_2$ in response to the positive input signal at time $t_1$. On the other hand, the inverting device responds almost immediately on the negative edge of the input signal a by going positive immediately at time $t_3$. In other words, the inverted pulse b terminates basically at the same time with the negatively going edge of the pulse a, since the inverting device has no noticeable delay for edges that go negative. In other words, the pulse a is shortened at the same time as it is delayed. In order to maintain a correct pulse length, the pulse b is applied to a further identical inverting device which has the same adjustable delay DLY for the positive edge of the input signal. The second inverting device will switch to a high output signal immediately at time $t_3$ whereas when the pulse b goes positive at time $t_3$, the decline or fall of the output signal from the second inverting device will not take place until time $t_4$, i.e. after a delay DLY.

Figure 4:
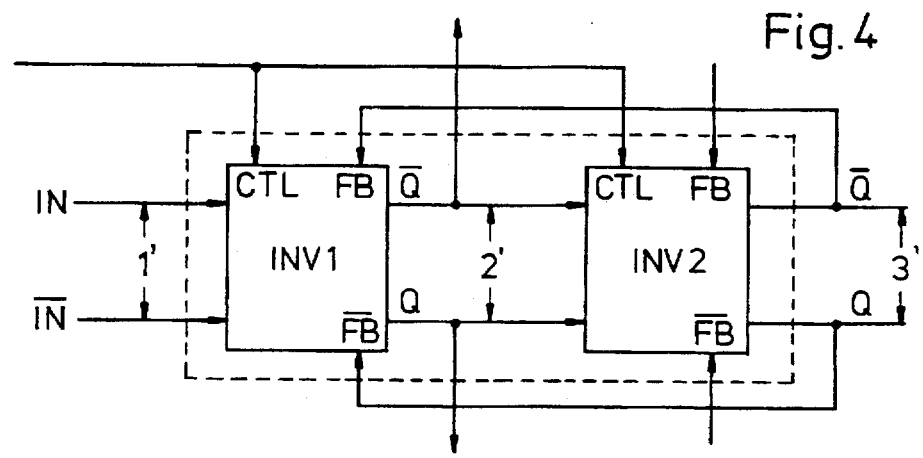
FIG. 4 illustrates a differential delay element with a pair of inverting devices in cascade, in accordance with an embodiment of the invention.

FIG. 4 is a block diagram illustrating a delay element DDE in accordance with an embodiment the present invention, including a first inverting device INV1 and a second inverting device INV2. The mutually identical inverting devices INV1 and INV2 have differential inputs and outputs and feedback inputs FB and $\overline{FB}$. Each inverting device also has an input CTL for a control voltage which, in the preferred embodiment, determines the delay time of a negative going edge. The control voltage on the input CTL determines the slope of the ramp used to obtain the time delay of, in this case, the negative going edge of the pulse signal to be delayed, which is shown with the aid of FIG. 5.

Figure 5:
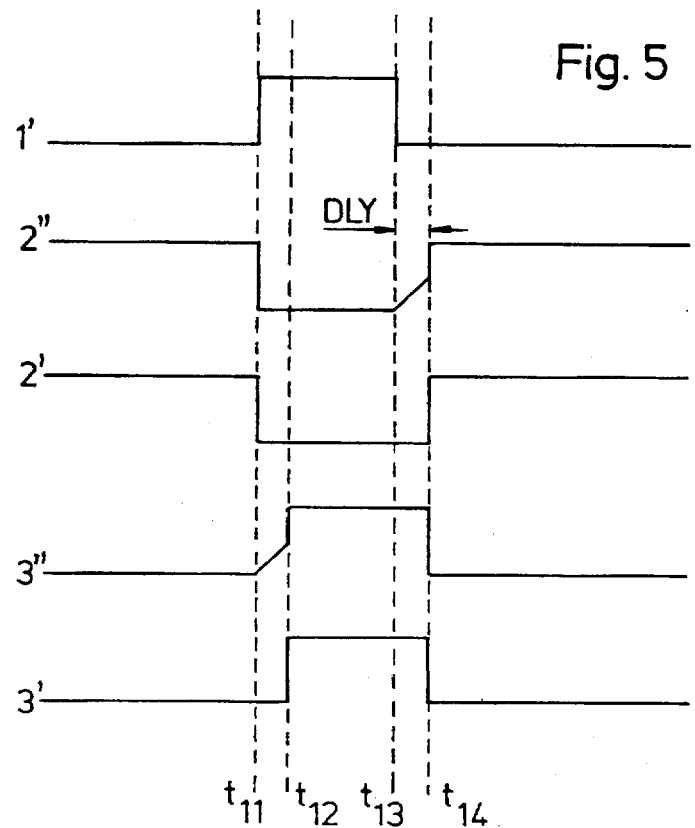
FIG. 5 is a schematic time diagram of pulse forms in a differential delay element according to FIG. 4.

FIG. 5 illustrates five time-diagrams of which 1', 2' and 3' correspond to logic input and output signals for the inverting devices INV1 and INV2 in the delay element shown in FIG. 4, whereas the time diagrams 2" and 3" illustrate an electric signal in each inverting device prior to level restoration. The signal 1' shows a pulse which goes high between the times $t_{11}$ and $t_{12}$. The first inverting device detects the signal 1' and creates an inverted signal 2' which starts at $t_{11}$. The first inverting device has an adjustable delay for the negative edge of the pulse signal 1'. This delay is created by starting a ramp at $t_{13}$ when the signal 1' goes negative. When the ramp reaches a given threshold value, the ramp switches to a full logic level which produces a delay $DLY = t_{13} - t_{14}$ for the rear edge of the pulse signal 1'. The level of this edge is then restored in the inverting device INV1, and a signal 2' is produced and applied to the second inverting device INV2. Correspondingly, the negative going first edge of the signal 2' starts a ramp for the second inverting device INV2. At a corresponding threshold, the ramp produces a full logic level for the front edge of the signal 3" at time $t_{12}$, wherewith $DLY = t_{11} - t_{12} = t_{13} - t_{14}$. The level of this edge is then restored in the inverter INV2 and a signal 3' is fed-out from the delay element DDE. The ramp threshold value will normally lie at 50% of the difference between the logic value "0" and the logic value "1". The slope of the ramp is set with the input voltage on connection CTL, i.e. the time constant for the change-over in the inverting device for the negative edge in. When the threshold value is reached and the output Q and the output $\overline{Q}$ go high, the time constant of the ramp is short-circuited on the input of INV1 by the feedback from the output Q and $\overline{Q}$ respectively on INV2 to the input FB and $\overline{FB}$ respectively on INV1, as will be explained in more detail with reference to FIG. 6, which illustrates an inventive inverting device in greater detail.

Figure 6:
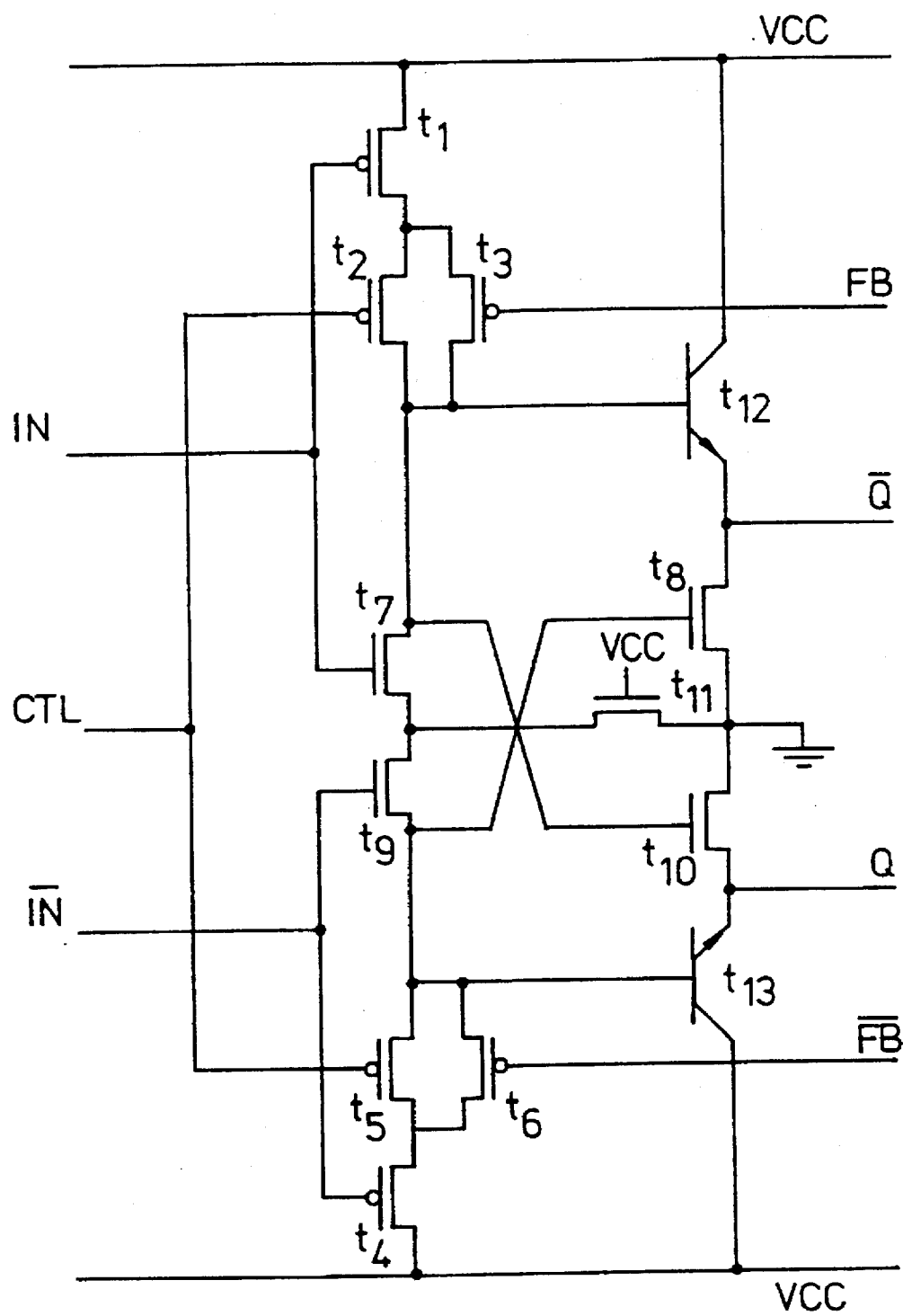
FIG. 6 illustrates an embodiment of a circuit for one of the mutually identical inverting devices in a differential delay element in accordance with the present invention.

FIG. 6 illustrates a preferred embodiment of a circuit for an inverting device having a controllable time constant for the negative going pulse edge and corresponding blocks INV1 or INV2 in a delaying element DDE in accordance with an embodiment of the present invention. The inverting device is comprised of 13 transistors and is intended to be integrated as a unit on a substrate chip or wafer, for instance a silicon chip, wherein many such devices can be mounted on one and the same chip. The transistors $T_1$–$T_6$ are comprised of field effect structures having P-channels, whereas the transistors $T_7$–$T_{11}$ are comprised of field effect structures having N-channels, and the transistors $T_{12}$ and $T_{13}$ are two bipolar transistors of the NPN type. The device has a differential input between IN and $\overline{IN}$ and a differential output between Q and $\overline{Q}$. The connection IN is coupled to the gate electrodes of the transistors $T_1$ and $T_7$, while the connection $\overline{IN}$ is coupled to the gate electrodes of the transistors $T_4$ and $T_9$. The output $\overline{Q}$ is coupled between the transistor $T_8$ and the emitter on the bipolar transistor $T_{12}$ and the output Q is coupled between the transistor $T_{10}$ and the emitter on the bipolar transistor $T_{13}$. The gate electrodes of the transistors $T_3$ and $T_6$ are coupled to the feedback inputs FB and $\overline{FB}$ respectively, whereas the gate electrodes of the transistors $T_2$ and $T_5$ are coupled to the input CTL for the ramp control voltage.

The bipolar NPN transistors $T_{12}$ and $T_{13}$ form current amplifying stages of low output impedance. The field effect transistors that include P-channels ($T_1$–$T_4$) conduct at low input voltages, whereas the field effect transistors that include N-channels ($T_7$–$T_{11}$) conduct at high input voltages. The transistors $T_1$, $T_7$ and $T_4$, $T_9$ therefore form an inverting stage whose cut-over or change-over for a negative voltage edge is controlled by a time link which is formed by the combination of stray capacitances and the base-emitter capacitance in the bipolar NPN transistor $T_{12}$ and $T_{13}$ respectively, together with the channel resistance in $T_2$ and $T_5$ respectively, which is controlled by the voltage applied via the input CTL. When the respective gate electrodes of the transistors $T_3$ and $T_6$ are placed on a low potential, the transistors will short-circuit respective parallel transistor $T_2$ and $T_5$, resulting in short-circuiting of the channel resistance which provides the time constant in the time link. The function of the circuit illustrated in FIG. 6 thus corresponds to the function demonstrated by the time diagram in FIG. 5.

As a result of the symmetrical construction of the delay element DDE having two inverting devices INV1 and INV2 in accordance with FIGS. 4 and 6 respectively, it is relatively easy to construct a delay line for, in principle, any desired delay in accordance with FIG. 2. After each incremental delay of the digital signal it is ensured that the pulse width is maintained while, at the same time, obtaining a well-defined pulse form and hence achieving very low signal distortion with an even number of inverting devices. Because each DDE is constructed symmetrically, it is relatively easy to feedback from the respective outputs Q and $\overline{Q}$ on INV2 to the respective inputs FB and $\overline{FB}$ on INV1, and to feed the signals on the outputs Q and $\overline{Q}$ on INV1 in a delay element DDE back to the inputs FB and $\overline{FB}$ on INV2 in the preceding delay element DD1. In other words, a delay element DDE' is formed in this way with the inverting devices INV2 and INV1, and consequently this feedback to a preceding stage is obtained constantly in accordance with the invention. All inputs CTL on the inverting devices in all DDEs which form the delay line are together coupled to a common control supply which determines the incremental delay in each DDE and therewith the total delay in the combined digital delay line.

The number of delay elements DDE in one such differential delay line is chosen so that the total delay that can be obtained will reach, for instance, one unit interval of the signal to be delayed and for instance with 10% for each DDE, even though it is theoretically possible to adjust up to almost 100% of the pulse length with a DDE. Thus, there is constructed with the aid of a number of DDEs a phase aligner whose delay of a digital input signal can be readily voltage controlled.

Figure 7:
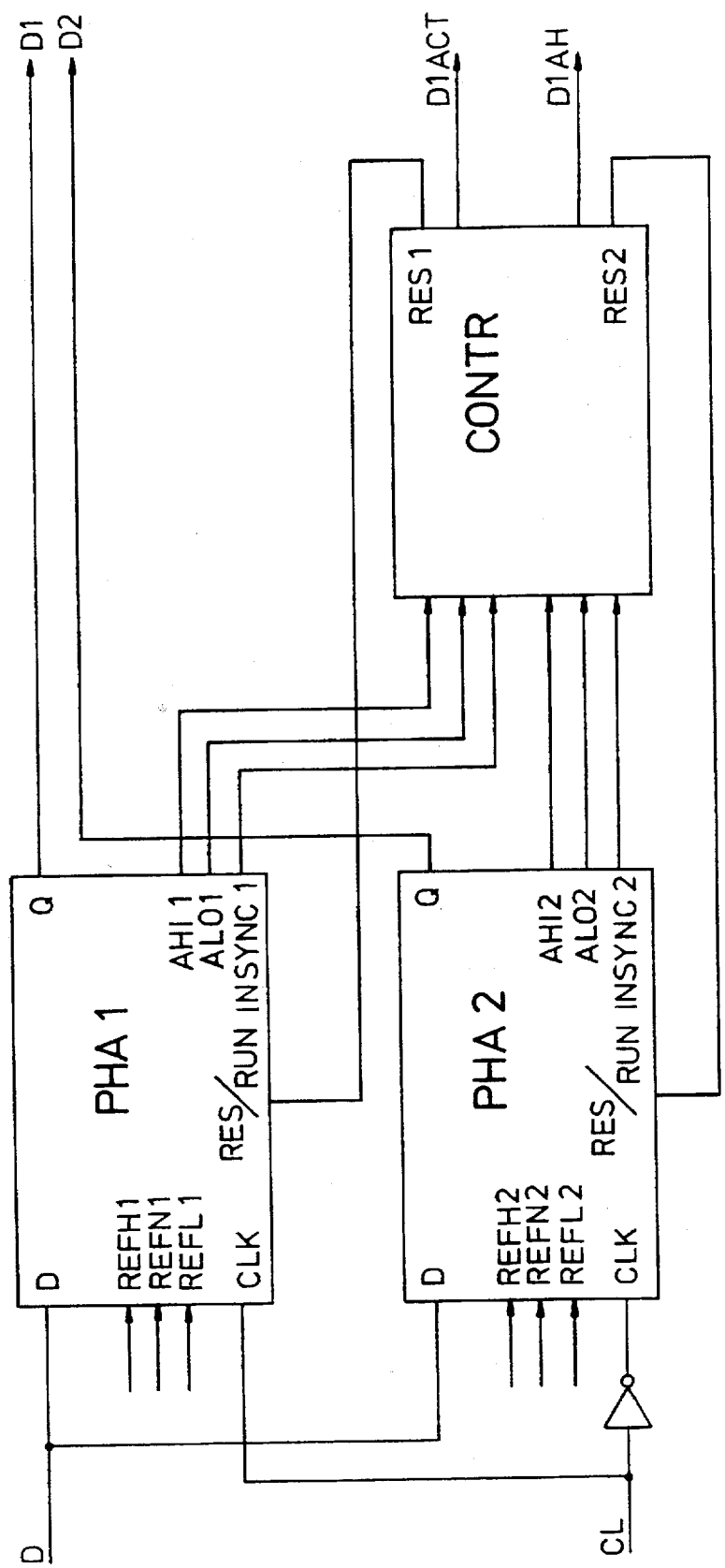
FIG. 7 is a block diagram of a phase aligning part of a bit synchronizer which includes two phase aligners in accordance with an embodiment of the present invention.
Figure 8:
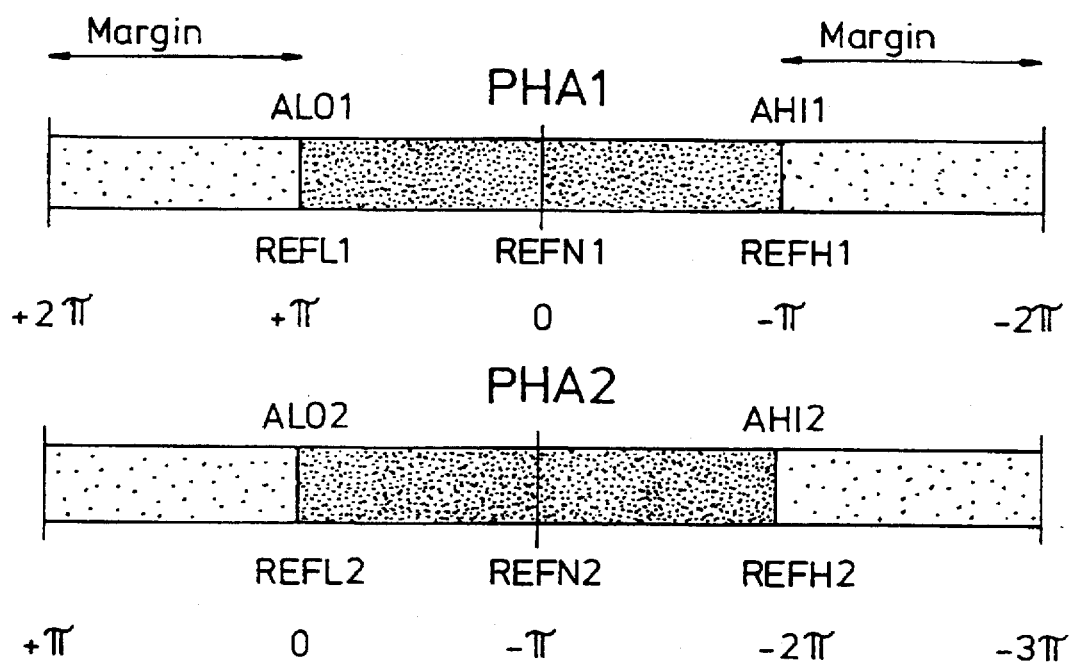
FIG. 8 illustrates the functional regions of a first and a second phase aligner in a bit synchronizer in accordance with the invention.

A bit synchronizer is constructed by using two phase aligners PHA1 and PHA2, shown in FIG. 7, each of which includes a respective differential delay line in accordance with an embodiment of the invention. The two phase aligners are given slightly different phase adjustment ranges, wherein the first phase aligner PHA1 has a phase adjustment range which extends from a minimum value to a first maximum value having the magnitude of at least one unit interval, whereas the second phase aligner PHA2 has a phase adjustment range which extends from the minimum value plus preferably at least one-half of a unit interval to a second maximum value and in total corresponds at least to one unit interval. An example of the phase adjustment ranges of the two phase aligners PHA1 and PHA2 is shown in FIG. 8. In order to minimize the requisite adjustment range of the phase aligners, an inverted clock signal has in this case been applied to the phase aligner PHA2. In this way, there is obtained in the working range of the phase aligner a shift of one-half bit interval. Both PHA1 and PHA2 are constructed so as to be able to operate slightly above an upper alarm level AHI1 and AHI2, and also slightly beneath a bottom alarm level ALO1 and ALO2 respectively, thereby providing a functional margin. According to FIG. 8, the respective margins for PHA1 and PHA2 are +π and −π, whereas the working region of the illustrative embodiment is 2π.

A change-over which causes one phase aligner to be active or enabled while the other phase aligner is disabled or in a rest state is controlled by a function control referenced CONTR in FIG. 7. This control function ensures that the active phase aligner is able to operate well within its phase control range. The function control operates to ensure that the first phase aligner is activated and the second phase aligner is in its rest state, wherein the second phase aligner in a rest state will take over phase alignment as soon as there is a danger of the first, active phase aligner moving outside its delay adjustment range as a result of following a varying phase relationship between the plesiochronous local clock and the bit data stream. The first phase aligner in a rest state will also take over phase alignment immediately if the second active phase aligner is in danger of passing outside its delay adjustment range. This is achieved simply by the function control monitoring primarily a control voltage which is applied to the control input CTL of the differential delay line of the active phase aligner.

According to the embodiment illustrated in FIG. 7, the digital signal D to be delayed is passed through both phase aligners PHA1 and PHA2, which in turn deliver respective signals D1 and D2. The function control CONTR decides which of the signals D1 and D2 shall be converted, on the basis of the signals INSYNC, ALO and AHI from the two phase aligners PHA. In other words, the function control determines which of the phase aligners PHA1 and PHA2 is the active phase aligner. Both phase aligners PHA1 and PHA2 also obtain a clock signal CL as its reference, wherein in the illustrated case PHA2 will receive this clock signal inverted, i.e. in principle displaced by one-half of a time interval, which results in the shift in working range illustrated in FIG. 8. The too high alarm signals AHI and the too low alarm signals ALO flag, for instance, the upper and the lower limits of the phase adjustment range. Reference signals REFH1, REFN1, REFL1 and REFH2, REFN2, REFL2 are also supplied to respective phase aligners PHA1 and PHA2, so as to create the signals AHI, ALO, INSYNC applied to the function control so that its logic will be able to decide which of the phase aligners operates the most favorably, in a known manner.

The references REFH state the high limit of the phase adjustment range, the references REFN state a nominal centre region of the phase adjustment range, and the references REFL state the low limit of the phase adjustment range and are generated with the aid of adapted reference voltage generators which, in accordance with the invention, utilize the same type of phase aligners including differential delay lines which are copies of those used in the phase aligners PHA1 and PHA2 in the actual bit synchronizer.

The adaptive reference voltage generators thus use copies of the phase aligners to generate reference voltages which define the relevant usable delay range in the bit synchronizer. Each reference generator also includes two phase aligners where the control voltage of one phase aligner is forced so that the delay is the minimum delay that can be achieved during prevailing function conditions. The feedback loop of the other phase aligner is activated, although instead of phase aligning towards a clock signal, the delay is adjusted so that the delay line output data will be phase aligned with data arriving from that delay line which is forced to operate at minimum delay. The same data signal of fixed pattern is delivered to both delay lines, although the signal delivered to the delay line which is forced to minimum delay is first delayed in a series of bi-stable flip-flops and/or is stored intermediately. In the case of the first reference generator which generates the lower alarm level or threshold, a single intermediate storage which will delay the fixed data pattern by one-half of a clock period is appropriate. This means that the second phase alignment control voltage will be the voltage at which the delay is equal to one-half unit interval from the level at which the phase aligners cease to be adjustable in a downward sense. This voltage level is delivered from the reference voltage generator as the low delay alarm voltage. Bit synchronizers are able to use this level as the lower delay limit for the phase aligners for bit synchronization. One-half unit interval provides a sufficient phase drift margin for the active phase aligner while the newly activated phase aligner seeks its equilibrium state.

The upper alarm limit is generated in a second reference voltage generator which operates in a similar manner. The one difference is that the deviation in time domain between the infeed patterns to the two phase aligners of the reference generator is, for instance, one and one-half unit interval instead of one-half unit interval. The bit synchronizers will use this reference voltage to monitor their respective phase aligner so as not to operate at an excessively high delay level. As before mentioned, the delay lines are constructed so as to be able to operate up to delay levels which exceed the high alarm level, so as to provide room for a given overlap during the hand-over procedure, see also FIG. 8. The adaptive voltage generators are also important because the usable delay operation range of the phase aligner will also depend, of course, on supply voltage, circuit characteristics and temperature in addition to the phase position of the incoming data signal.

Figure 9A:
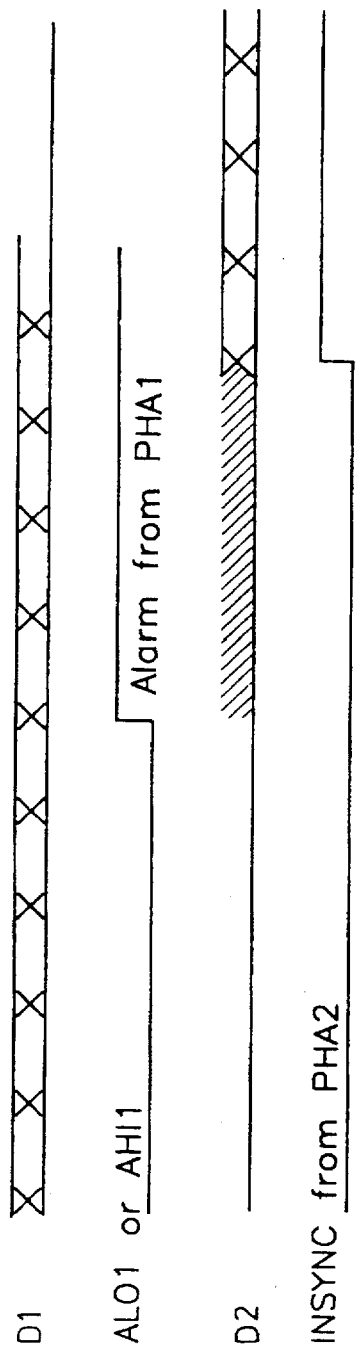
FIG. 9a illustrates with the aid of a signal diagram a relationship between an alarm signal ALO1 or AHI1 from PHA1 and a resultant signal INSYNC2 from PHA2 with subsequent cut-over from D1 to D2 as an output signal from the bit synchronizer.
Figure 9B:
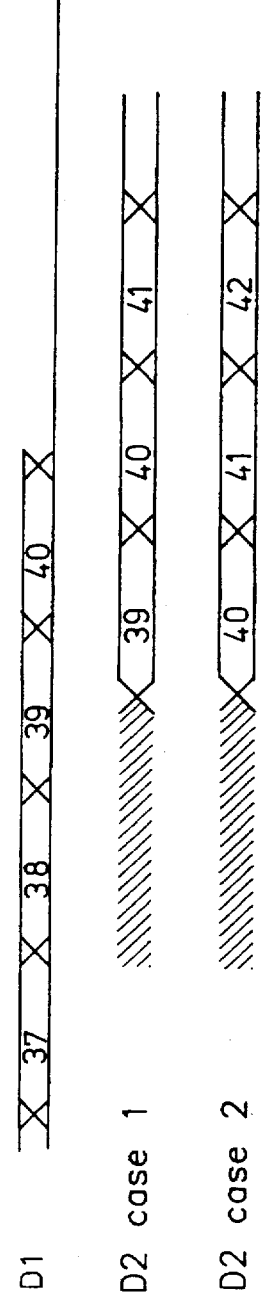
FIG. 9b illustrates in larger scale a part of the signal diagram in FIG. 9a at the precise point when the switch between D1 and D2 takes place because data has a lower or a higher frequency than the clock.

FIG. 9a illustrates schematically a state in which PHA1 is active and the signal D1 therefrom is the bit synchronizer output signal. The alarm level ALO1 or AHI1 is reached at a given point in time. The control CONTR steers PHA2 to the centre region of its working range, with the aid of REFN2. After a short period, PHA2 finds a stable state and therewith sets the signal INSYNC2 to "true" as an indication that PHA2 has now locked-in to the input signal with a correct delay. When the control CONTR receives the signal INSYNC2 indicating correct phase adjustment of the phase aligner, the control CONTR changes the output signal from D1 to D2. FIG. 9b illustrates more precisely how this change is effected in relation to whether data has a lower or a higher frequency than the clock. The control CONTR informs receiving logic (not shown) of the type of drift that has occurred. The receiving logic uses this information to handle input data correctly during the change-over period. If data speed is greater than clock speed, the receiving logic will thus deal with data from both phase aligners during the change-over period. If data speed is slower than clock speed, it is necessary for the receiving logic to compensate, e.g., the occurrence of the same data bit 39 in mutually sequential periods during change-over. When a new state occurs, a corresponding operation can be effected against PHA1, so as to obtain the alarm level ALO2 or AHI2, wherein PHA1 is synchronized and signals with signal INSYNC1 that a change back to D1 can take place.

The bit synchronizers are able to handle data signals which are plesiochronous in relation to their own clock, because the delay control voltage of the phase adjuster is controlled so that the delay will be changed by a magnitude which equals the phase drift between clock and data. In this way, the output signal obtains a stable phase position in relation to the clock, i.e. it is synchronized. Since the phase aligner has a finite working range, a phase drift would be able to cause a malfunction by forcing the phase aligner out of its permitted working range. Accordingly, the phase aligner signals to the control logic with either the signal AHI or ALO that it is approaching the upper or the lower limit of its working range in good time before this danger becomes a reality. The control logic replies by activating the phase aligner that has been held inactive. An inactive phase aligner is forced to the centre region of its working range with the aid of the reference voltage REFN. As described in FIG. 8, the alarm levels or thresholds AHI and ALO are selected so that when the active phase aligner operates in the vicinity of the alarm level, the delay loop of the inactive phase aligner will have an equilibrium state in the vicinity of the centre of said working range. When the active phase aligner passes an alarm level, the phase aligner that has been inactive is activated. The phase aligner then seeks the equilibrium state in the vicinity of the centre region of the working range, so as to achieve correct synchronization. When this phase aligner has reached the equilibrium state, its flag INSYNC to the control logic is set equal to "true", whereupon the control logic responds by switching active phase aligners.

According to the present invention, it is possible to construct a bit synchronizer which is able to phase align an incoming date bit stream to the local isochronous time domain for simple interpretation and processing of the bit data stream in a positive manner and without signal distortion, by using digital delay lines which are constructed from delay elements which comprise paired inverting devices having a time delay for positive signal edges or alternatively for negative signal edges, said time delay being controllable by an applied voltage level.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A bit synchronizer for interpreting a bit data stream of preferably high data speed received by a receiver in a plesiochronous communication system having a global reference clock, said synchronizer comprising:

a first phase aligner and a second phase aligner; said first phase aligner being designated as a primary phase aligner and said second phase aligner being designated as a secondary phase aligner, said secondary phase aligner being deactivated into a standby state when the primary phase aligner delay is within a delay adjustment range, wherein when the primary phase aligner is in danger of leaving its delay adjustment range as a result of following a varying phase relationship between said global clock and said bit data stream, said second phase aligner is activated and becomes the primary phase aligner upon achieving a lock to said global clock, said first phase aligner then becomes the secondary phase aligner being deactivated into a standby state when instructed by a function control, wherein the first phase aligner is ready to take over phase alignment when said second phase aligner is in danger of leaving its delay adjustment range as a result of following a varying phase relationship between said said reference clock and said bit data stream.

2. The bit synchronizer according to claim 1, wherein the change between first and second phase aligners being designated primary and secondary phase aligners respectively is effected with the aid of said function control which monitors the working point of the primary and secondary phase aligners and instructs the receiver how to handle the output from the first and second phase aligners during switchover.

3. The bit synchronizer according to claim 1, further comprising an adaptive reference generator which controls said control unit for alternating activation and deactivation of said first and second phase aligners, said adaptive reference generator uses third and fourth phase aligners which, in turn, are copies of the first and second phase aligners to be controlled, wherein a reference signal is generated as a delay line control voltage, by phase alignment of the output signal from said fourth phase aligner to the output signal from said third phase aligner, those being the subject of two digital signal patterns of which one signal pattern delivered to said third phase aligner is a delayed copy of the signal delivered to said fourth phase aligner, and this delay being a predetermined number of half clock periods where said predetermined number is a positive integer.

4. The bit synchronizer according to claim 2, wherein a continuity between output of the first and second phase aligners is achieved by shifting the working point between said first and second phase aligners by one-half local unit interval either up or down, and by alternating between the output from said first or second phase aligner and receiving data from both said first and second phase aligners during the alternating or switching period, said data differing by only one-half unit interval.

5. A bit synchronizer for interpreting a bit data stream of preferably high data speed received by a receiver in a plesiochronous communication system, said synchronizer comprising:

a first phase aligner and a second phase aligner for synchronizing; said first phase aligner being designated as a primary phase aligner and said second phase aligner being designated as a secondary phase aligner, said secondary phase aligner being deactivated into a standby state when the primary phase aligner delay is within a delay adjustment range, wherein when the primary phase aligner is in danger of leaving its delay adjustment range as a result of following a varying phase relationship between a system clock and said bit data stream, said second phase aligner is activated and becomes the primary phase aligner upon achieving a lock to said system clock, said first phase aligner then becomes the secondary phase aligner being deactivated into a standby state when the primary phase aligner is within its delay adjustment range, wherein the first phase aligner is ready to take over phase alignment when said second phase aligner is in danger of leaving its delay adjustment range as a result of following a varying phase relationship between said system clock and said bit data stream, wherein a function control alternates activation and deactivation of said respective first phase aligner and second phase aligner as primary and secondary phase aligners based on monitoring the operating point of a delay line delay control voltage of the primary phase aligner.

6. A bit synchronizer for interpreting a bit data stream of preferably high data speed received by a receiver in a plesiochronous communication system, said synchronizer comprising:

a first phase aligner and a second phase aligner; said first phase aligner being designated as a primary phase aligner and said second phase aligner being designated as a secondary phase aligner, said secondary phase aligner being deactivated into a standby state when the primary phase aligner delay is within a delay adjustment range, wherein when the primary phase aligner is in danger of leaving its delay adjustment range as a result of following a varying phase relationship between a system clock and said bit data stream, said second phase aligner is activated and becomes the primary phase aligner upon achieving a lock to said system clock, said first phase aligner then becomes the secondary phase aligner being deactivated into a standby state when the primary phase aligner is within its delay adjustment range, wherein the first phase aligner is ready to take over phase alignment when said second phase aligner is in danger of leaving its delay adjustment range as a result of following a varying phase relationship between said system clock and said bit data stream, wherein a function control provides said first phase aligner with a phase adjustment range which extends from a minimum value to a first maximum value in the order of at least one unit interval, and provides said second phase aligner with a phase adjustment range which extends from the minimum value plus preferably at least one-half unit interval to a second maximum value; the total phase adjustment range corresponding to at least one unit interval.

7. A bit synchronizer for interpreting a bit data stream of preferably high data speed received by a receiver in a plesiochronous communication system, said synchronizer comprising:

a first phase aligner and a second phase aligner; said first phase aligner being designated as a primary phase aligner and said second phase aligner being designated as a secondary phase aligner, said secondary phase aligner being deactivated into a standby state when the primary phase aligner delay is within a delay adjustment range, wherein when the primary phase aligner is in danger of leaving its delay adjustment range as a result of following a varying phase relationship between a system clock and said bit data stream, said second phase aligner is activated and becomes the primary phase aligner upon achieving a lock to said system clock, said first phase aligner then becomes the secondary phase aligner being deactivated into a standby state when the primary phase aligner is within its delay adjustment range, wherein the first phase aligner is ready to take over phase alignment when said second phase aligner is in danger of leaving its delay adjustment range as a result of following a varying phase relationship between said system clock and said bit data stream; and an adaptive reference generator which controls a function control for alternating activation and deactivation of said first and second phase aligners, wherein said adaptive reference generator uses third and fourth phase aligners which, in turn, are copies of the first and second phase aligners to be controlled; said third phase aligner operating at an absolute minimum delay level and said fourth phase aligner operating at a delay level which is controlled in a locked delay loop to be a predetermined number of half clock periods above the absolute minimum delay level.

8. A bit synchronizer for interpreting a bit data stream of preferably high data speed received by a receiver in a plesiochronous communication system, said synchronizer comprising:

a first phase aligner and a second phase aligner, each having a delay adjustment range, said first phase aligner being designated as a primary phase aligner and said second phase aligner being designated as a secondary phase aligner, said secondary phase aligner being deactivated into a standby state when the primary phase aligner delay is within a delay adjustment range wherein when the primary phase aligner is in danger of leaving its delay adjustment range as a result of following a varying phase relationship between a system clock and said bit data stream said secondary phase aligner is activated and becomes the primary phase aligner upon achieving a lock with said system clock, and said first phase aligner then becomes the secondary phase aligner being deactivated in a standby state when the primary phase aligner is within its delay adjustment range, wherein said first phase aligner is ready to taking over phase alignment when said second phase aligner is in danger of leaving its delay adjustment range as a result of following a varying phase relationship between said system clock and said bit data stream and a changeover between the first and second phase aligners is effected continuously by shifting the working point between said first and second phase aligners by one-half local unit interval either up or down, and by alternating between the output from said first or second phase aligner and receiving data from both said first and second phase aligners during the alternating or switching period, said data differing by only one-half unit interval.

9. A bit synchronizer for interpreting a bit data stream of preferably high data speed received by a receiver in a plesiochronous communication system, said synchronizer comprising:

a first phase aligner and a second phase aligner, each having a delay adjustment range, said first phase aligner being designated as a primary phase aligner and said second phase aligner being designated as a secondary phase aligner, said secondary phase aligner being deactivated into a standby state when the primary phase aligner delay is within a delay adjustment range wherein when the primary phase aligner is in danger of leaving its delay adjustment range as a result of following a varying phase relationship between a system clock and said bit data stream said secondary phase aligner is activated and becomes the primary phase aligner upon achieving a lock with said system clock;

and an adaptive reference generator which controls a function control for alternating activation and deactivation of said first and second phase aligners, said adaptive reference generator uses third and fourth phase aligners which, in turn, are copies of the first and second phase aligners to be controlled, wherein a reference signal is generated by phase alignment of the output signal from said fourth phase aligner to the output signal from said third phase aligner, those being the subject of two digital signal patterns of which one signal pattern delivered to said third phase aligner is a delayed copy of the signal delivered to said fourth phase aligner, and this delay being a predetermined number of half clock periods where said predetermined number is a positive integer.

* * * * *